(12) United States Patent
Kakugawa et al.

(10) Patent No.: US 6,937,017 B2
(45) Date of Patent: Aug. 30, 2005

(54) MAGNETIC POLE MAGNET DEVICE USING THE MAGNETIC POLE, AND MAGNETIC RESONANCE IMAGING APPARATUS

(75) Inventors: Shigeru Kakugawa, Hitachi (JP); Yoshihide Wadayama, Hitachiota (JP); Hirotaka Takeshima, Ryugasaki (JP); Takeshi Yatsuo, Kashiwa (JP); Kenji Sakakibara, Kashiwa (JP)

(73) Assignees: Hitachi, Ltd., Tokyo (JP); Hitachi Medical Corporation, Tokyo (JP)

( * ) Notice: Subject to any disclaimer, the term of this patent is extended or adjusted under 35 U.S.C. 154(b) by 2 days.

(21) Appl. No.: 10/468,793

(22) PCT Filed: Feb. 27, 2002

(86) PCT No.: PCT/JP02/01826

§ 371 (c)(1),
(2), (4) Date: Jan. 15, 2004

(87) PCT Pub. No.: WO02/071941

PCT Pub. Date: Sep. 19, 2002

(65) Prior Publication Data

US 2004/0124839 A1 Jul. 1, 2004

(30) Foreign Application Priority Data

Mar. 2, 2001 (JP) ........................................ 2001-58481

(51) Int. Cl.⁷ .............................................. G01V 3/00
(52) U.S. Cl. ...................................... 324/319; 324/318
(58) Field of Search ................................ 324/319, 318, 324/322; 335/297, 296; 250/294

(56) References Cited

U.S. PATENT DOCUMENTS 5,592,089 A    1/1997   Danby et al.
6,236,043 B1 * 5/2001   Tadokoro et al. ........... 250/298
6,259,252 B1   7/2001   Laskaris et al.

FOREIGN PATENT DOCUMENTS

| JP | 2-117106 | 5/1990 |
|----|----------|--------|
| JP | 4-246330 | 9/1992 |
| JP | 8-172010 | 7/1996 |
| JP | 8-243087 | 9/1996 |
| JP | 10-146326 | 6/1998 |
| JP | 11-26198 | 1/1999 |
| JP | 2000-157510 | 6/2000 |
| WO | WO99/27851 | 6/1999 |

\* cited by examiner

*Primary Examiner*—Brij B. Shrivastav
(74) *Attorney, Agent, or Firm*—Mattingly, Stanger, Malur & Brundige, P.C.

(57) ABSTRACT

The present invention is intended to provide a magnetic pole, a magnet apparatus, and a magnetic resonance imaging apparatus that the magnetic structure of the magnet apparatus for generating a uniform magnetic field is formed in a lower burst mode, and the profitability is increased, and at the same time, the uniformity of the magnetic field is improved.

According to the present invention, the magnetic poles arranged opposite to each other across a measuring space have at least one of a plurality of hollows and a single hollow having a shape continuously changing on the section perpendicular to the direction of the magnetic field formed in the measuring space and particularly in order to make the magnetic field uniform, the arrangement of the plurality of hollows and the shape of the single hollow are adjusted. The magnet apparatus and magnetic resonance imaging apparatus of the present invention are structured as mentioned above.

21 Claims, 9 Drawing Sheets

MAGNETIC POLE MAGNET DEVICE USING THE MAGNETIC POLE, AND MAGNETIC RESONANCE IMAGING APPARATUS

BACKGROUND OF THE INVENTION

1. Field of the Invention

The present invention relates to a new magnetic pole, a magnet apparatus using it, and a magnetic resonance imaging apparatus.

2. Description of the Prior Art

In recent years, in the field of a nuclear magnetic resonance imaging (MRI) apparatus, an MRI apparatus using the so-called open type magnet that static magnetic field generation sources are arranged opposite to each other vertically or horizontally across a scanning space is under-development. Such an MRI apparatus has a sufficient open character, permits the so-called IVR (interventional radiology), and greatly expands medical possibilities.

It is essential for a magnet for an MRI apparatus to produce a uniform static magnetic field of several ppm in a scanning space. The method for making the magnetic field of the scanning space uniform is broadly divided into two ways such as a method for using a plurality of coils and optimizing the arrangement thereof and a method for using the so-called magnetic pole and optimizing the surface shape thereof.

As a superconductive magnet suitable for an open-type MRI apparatus using the former method, the magnet apparatus disclosed in WO99/27851 MAGNET APPARATUS AND MRI APPARATUS may be cited. The magnet is composed of two sets of magnet assemblies opposite to each other across the scanning area of an MRI image. Each magnet assembly has a plurality of superconductive coils, which are arranged almost symmetrically about the central axis. The main coils are composed of coils of positive polarity and negative polarity which are alternately arranged, thus the compact magnets can generate a highly uniform magnetic field.

On the other hand, a magnet apparatus using the latter method is disclosed in Japanese Application Patent Laid-Open Publication No. 8-172010 and U.S. Pat. No. 5,592,089. A typical example thereof is shown in FIG. 7, FIG. 5 is a vertical cross sectional view of a magnet. Support-shaped magnetic substances 5 and 6 and tabletop-shaped magnetic substrates 4a and 4b constitute a magnetic circuit, which lets magnetic flux generated by permanent magnets 3a and 3b pass through. Pole pieces 1a and 1b lead the magnetic flux generated by the permanent magnets 3a and 3b to the center of the magnet apparatus. Pole faces 2a and 2b, in order to make the magnetic flux distribution in the center of the magnet apparatus uniform, are not in a plane shape. Further, U.S. Pat. No. 5,592,089 indicates a structure of a magnetic pole that a circular ring-shaped hollow is formed between a cylindrical member and a ring-shaped member.

Japanese Application Patent Laid-Open Publication No 4-246330 indicates that to reduce changes in a magnetic field due to heat generation of a gradient coil, a heat insulating material is provided between the coil and a pole piece and Japanese Application Patent Laid-Open Publication No. 2-117106 and Japanese Application Patent Laid-Open Publication No 10-146326 indicate that to make a magnetic field in a measuring space uniform, a magnet or a coil for magnetic field adjustment is arranged in the outer periphery of a magnetic pole.

As a method for using a magnetic pole to make the magnetic field of the scanning space uniform, the former patent application indicates that irregularities are formed on the magnetic pole on the scanning space side, thus the flow of the magnetic field is controlled and the magnetic field is made uniform. However, in the magnet of this concept, a position error of the magnetic pole surface greatly changes the uniformity of the magnetic field, so that very severe production accuracy is required for the magnetic pole surface and after all, a problem arises that the cost of the magnet is increased. Further, a position error caused by the production accuracy of the magnetic pole surface cannot be avoided, so that when many magnets are manufactured, the uniformity of the magnetic field in the scanning space inevitably varies greatly between the respective magnets, thus shimming is difficult, and it is difficult to economically manufacture many magnets for generating a magnetic field of several ppm in the scanning space.

Further, in the circular ring-shaped hollow indicated in U.S. Pat. No. 5,592,089, no uniform magnetic field can be formed.

SUMMARY OF THE INVENTION

The present invention is intended to provide a magnetic pole, a magnet apparatus using it, and a magnetic resonance imaging apparatus that a magnetic structure of a magnet apparatus for generating a uniform magnetic field is formed in a lower burst mode, and the profitability is increased, and at the same time, the uniformity of the magnetic field can be more improved.

According to the present invention, the magnetic poles arranged opposite to each other across a measuring space have at least one of a plurality of hollows and a single hollow having a shape continuously changing on the section perpendicular to the direction of the magnetic field formed in the measuring space.

Further, according to the present invention, the magnetic poles have at least one of a plurality of hollows for correcting an irregular magnetic field due to the aforementioned support magnetic substances and a single hollow having a shape continuously changing on the section perpendicular to the direction of the magnetic field formed in the measuring space and in order to make the magnetic field uniform, the arrangement of the plurality of hollows and the shape of the single hollow are adjusted.

Furthermore, according to the present invention, the magnetic poles may have at least one of a plurality of circular ring-shaped hollows and semicircular ring-shaped hollows formed concentrically with the central axis of the magnetic field, wherein the circular ring-shaped hollows are rectangular or elliptic on the section passing the central axis and perpendicular to the opposite face, or may have a circular ring-shaped and a semicircular ring-shaped hollow formed concentrically with the central axis of the magnetic field, or may have a circular ring-shaped and a semicircular ring-shaped hollow formed concentrically with the central axis of the magnetic field, wherein the hollows are rectangular or elliptic on the section passing the central axis and perpendicular to the opposite face.

Further, according to the present invention, the magnetic poles have at least one of a plurality of circular ring-shaped hollows and semicircular ring-shaped hollows formed concentrically with the central axis of the magnetic field or the magnetic poles have a circular ring-shaped hollow, which is rectangular or elliptic on the section parallel with the flow direction of the magnetic flux.

According to the present invention, a plurality of follows are formed, so that the flatness of the opposite faces of the magnetic poles can be made higher and the difference in the magnetic flux between the peripheral part and the central part can be made smaller. For that purpose, a plurality of hollows are required, and a combination thereof is obtained by calculation beforehand, thus a more accurate shape can be obtained. A simple shape is effective to form a more uniform magnetic field. By forming circular ring-shaped hollows, the opposite faces can be preferably made smooth.

Further, the outer peripheral parts of the opposite faces of the magnetic poles are ring projections, and the parts excluding the outer peripheral parts are formed in a flat shape, so that the uniformity of the magnetic field can be increased more. Each projection has flat opposite faces on the outer periphery and preferably is in a shape inclined linearly from the flat part thereof toward the central part.

Further, according to the present invention, in the magnet apparatus having a pair of magnetic poles arranged opposite to each other across a measuring space, for the magnetic poles, the aforementioned magnetic poles are used. According to the present invention, in a magnet apparatus that static magnetic field generation sources for generating a magnetic field in a finite region are arranged opposite to each other across the region, and the static magnetic field generation sources respectively have a magnetomotive force source, and the static magnetic field generation sources are respectively joined magnetically to the magnetomotive force sources, and circular magnetic poles are arranged facing the region, for the magnetic poles, the aforementioned magnetic poles are used.

According to the present invention, in a magnet apparatus that two sets of static magnetic field generation sources for generating a magnetic field in a finite region are arranged opposite to each other across the region, and the respective static magnetic field generation sources have a magnetomotive force source, and the respective static magnetic field generation sources are joined magnetically to the magnetomotive force sources, and circular magnetic poles are arranged facing the region, for the magnetic poles, the aforementioned magnetic poles are used in the same way.

In the hollows of the present invention, the section perpendicular to each pole face is made longer in the opposite direction than the radial direction and although horizontally long is acceptable, vertically long is preferable because the flow of the magnetic flux is little interrupted. Particularly, on the section thereof, a combination that the central part of each magnetic pole is horizontally longer than the periphery thereof is preferable, though the neighborhood of the central axis in the central part is preferably vertically longer than the peripheral part. Further, it is preferable that the section of each hollow is rectangular or elliptic, and the magnet apparatus has second magnetic substances magnetically joined to two sets of static magnetic field generation sources so as to form magnetic paths, and the second magnetic substances are magnetic yokes.

According to the present invention, in the magnet apparatus having a pair of magnetic poles arranged opposite to each other across a measuring space and permanent magnets arranged on the opposite outsides of the magnetic poles or in a magnet apparatus having a pair of magnetic poles arranged opposite to each other across a measuring space, a pair of superconductive coils arranged on the outer peripheries of the respective magnetic poles, a pair of gradient coils arranged on the magnetic poles on the measuring space side, and a pair of RF irradiation coils arranged on the gradient coils on the measuring space side, for the magnetic poles, the aforementioned magnetic poles are used.

The magnet apparatus preferably has second magnetic substances magnetically joined to two sets of static magnetic field generation sources so as to form magnetic paths.

According to the present invention, the magnetic resonance imaging apparatus includes a magnet apparatus having magnetic field generators arranged in the respective neighborhoods of a pair of magnetic poles arranged opposite to each other for giving a static magnetic field to a space to be measured across a patient, a gradient coil for inclining the intensity of the static magnetic field generated by the magnet apparatus and forming a gradient magnetic field, a gradient power source which is connected to the gradient coil and applies an voltage, a probe for transmitting a high frequency magnetic field to the patient and receiving a nuclear magnetic resonance signal from the patient, a high frequency magnetic field generator which is connected to the probe and generates the high frequency magnetic field, a calculator which is connected to the high frequency magnetic field generator and gradient power source, controls the high frequency magnetic field and gradient magnetic field, controls fetching of the nuclear magnetic resonance signal, and processes images, a bed for laying the patient down and transporting him into the static magnetic field by a driving means, and a display unit for inputting the signal calculated by the calculator and displaying it as a tomographic image, wherein for the magnet apparatus, the aforementioned magnet apparatus is used.

The driving mechanism for moving the bed preferably has a control means for setting the movement of the patient at a fixed speed.

DESCRIPTION OF THE PREFERRED EMBODIMENTS (Embodiment 1)

Figure 1:
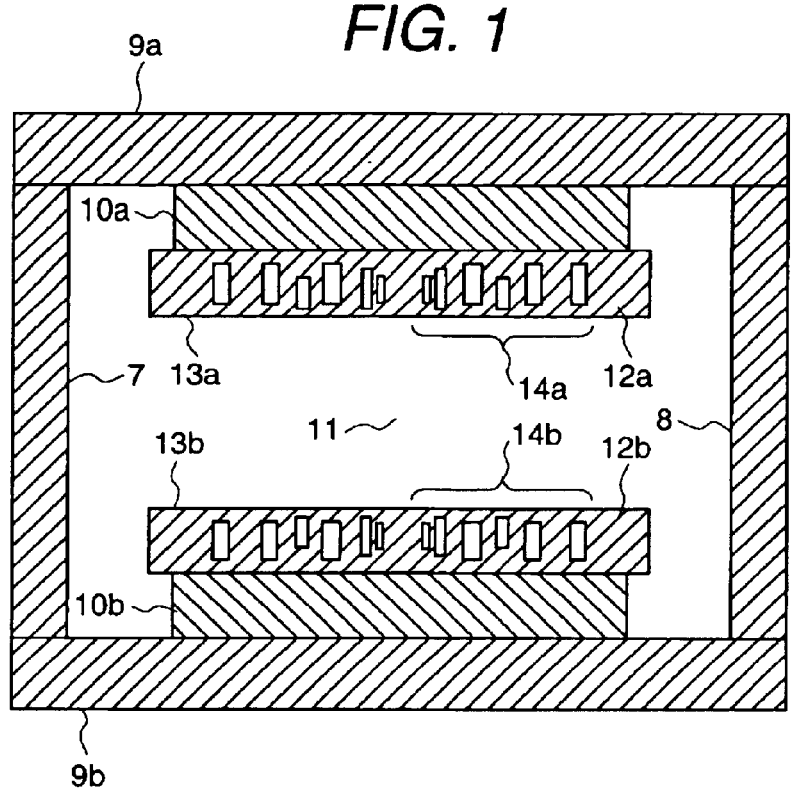
FIG. 1 is a cross sectional view of the magnet apparatus of Embodiment 1 of the present invention.

FIG. 1 is a cross sectional view of the magnet apparatus among the elements constituting an open type magnetic resonance imaging apparatus (MRI apparatus). Cylindrical support-shaped magnetic substances 7 and 8 and circular tabletop-shaped magnetic substances 9a and 9b constitute a magnetic circuit. These members are made of carbon steel of SS400 and the support-shaped magnetic substances 7 and 8 may be one-sided or composed of 4 pieces. Permanent magnets 10a and 10b generate magnetic flux and the magnetic flux passes through the magnetic circuit and flows almost perpendicularly to a space 11 at the central part of the magnets which is a measuring space. Pole pieces 12a and 12b are composed of a circular ferromagnetic substance such as pure iron or carbon steel and act so as to uniformly lead the magnetic flux generated by the circular permanent magnets 10a and 10b to the space 11 at the central part of the magnets and the pole pieces 12a and 12b are larger in diameter than the permanent magnets 10a and 10b. Opposite pole faces 13a and 13b are almost flat. The upper and lower pole pieces 12a and 12b are provided with circular ring-shaped hollows 14a and 14b having a rectangular section and the largest diameter thereof is made smaller than the diameters of the permanent magnets 10a and 10b. The sections of the respective circular ring-shaped hollows, as shown in the drawing, are made longer in the opposite direction of the magnetic poles, that is, in the vertical direction on the section parallel with the flow direction of the magnetic flux. Further, the respective circular ring-shaped hollows are formed concentrically with the central axis of the magnetic field.

In the circular ring-shaped hollows 14a and 14b, as shown in FIG. 1, starting from the center side of the magnetic field, the smallest first space, the second space which is equal in width to and longer in the axial direction than the first space, the third space which is equal in length to, largest in width, and slightly longer horizontally than the first space, the fourth space which is slightly smaller in width than and vertically longer than the third space, and the fifth and sixth spaces which are slightly longer than the fourth space are sequentially formed. The first, second, and fourth spaces are positioned slightly on the opposite side from the centers of the pole pieces 12a and 12b, and the third, fifth, and sixth spaces are positioned almost at the centers, and the upper and lower poles 12a and 12b have the same shape exactly symmetrically.

The pole pieces 12a and 12b may be an integral structure. However, a structure composed of a combination of a plurality of members in a simple shape is suited to form more accurate pole pieces. Particularly, a structure formed by two upper and lower members is preferable and on the common end face on the opposite face side of the circular ring-shaped hollows 14a and 14b, mutually necessary slits corresponding to the circular ring-shaped hollows 14a and 14b are formed and joined from the two members. These members can be integrally joined by use of a metal or mechanically by bolts.

Further, as shown in FIG. 1, the circular ring-shaped hollows 14a and 14b are arranged symmetrically at the respective opposite positions, formed concentrically with the central axis of the magnetic field, have the same sectional shape on the section parallel with the flow direction of the magnetic flux at the opposite position, and as aforementioned, have different sectional shapes.

These shapes are shapes obtained beforehand by calculation for a simple shape such as a quadrilateral or an ellipse, thereby a uniform magnetic field is formed.

In this embodiment, on the opposite face sides of the pole pieces 12a and 12b, gradient coils not shown in the drawing can be provided.

Figure 2:
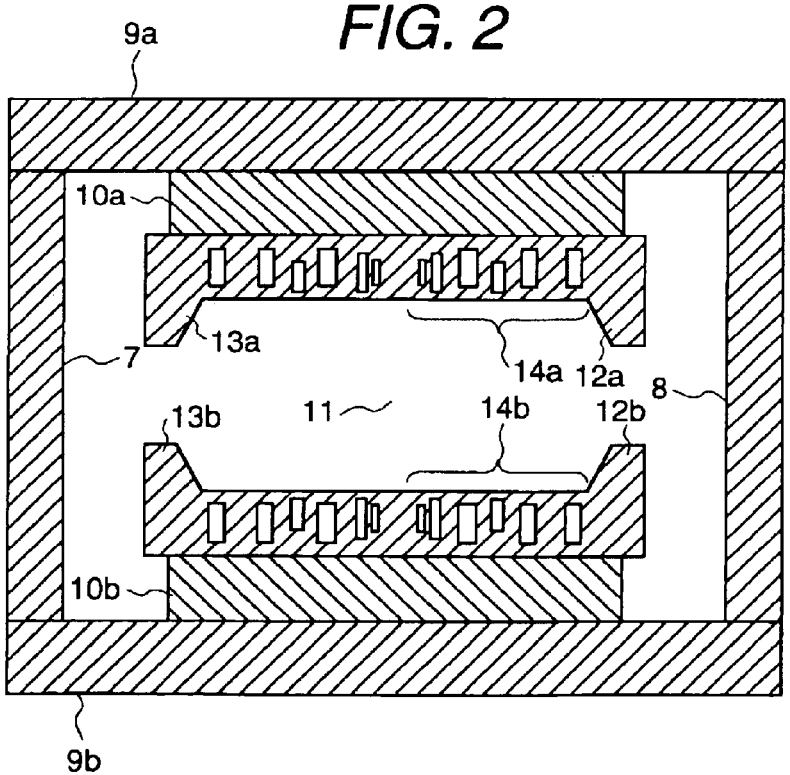
FIG. 2 is a cross sectional view of the magnet apparatus of Embodiment 1 of the present invention.

Furthermore, as shown in FIG. 2, ring projections can be provided around the magnetic poles. By the projections, the uniformity of the magnetic field in the measuring space can be increased more. Also in FIG. 2, the pole pieces 12a and 12b are larger in diameter than the permanent magnets 10a and 10b, and the largest diameter of the circular ring-shaped hollows 14a and 14b is smaller than the diameters of the permanent magnets 10a and 10b, and the hollows are formed on the smooth faces on the inner periphery sides of the projections. The ring projections have a trapezoidal shape. However, there are projections in a shape of a straight rectangle or in a shape of trapezoid at the base thereof.

According to this embodiment, a magnet apparatus that the magnetic structure of the magnet apparatus for generating a uniform magnetic field using the magnetic poles is formed in a lower burst mode, and the cost of the magnets is decreased after all, and at the same time, the properties such as the uniformity of the magnetic field are improved, particularly a magnet apparatus suitable for MRI can be obtained.

(Embodiment 2)

Figure 3:
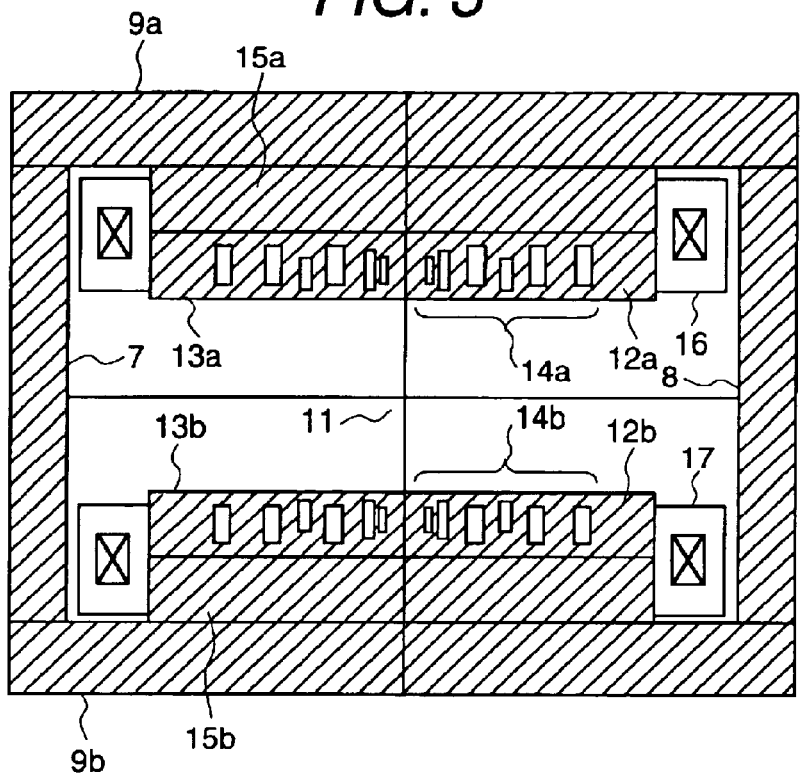
FIG. 3 is a cross sectional view of the magnet apparatus of Embodiment 2 of the present invention.

FIG. 3 is a cross sectional view showing a magnet apparatus of another embodiment. This magnet apparatus generates a uniform magnetic field in the Z-axial direction in the open region by two upper and lower sets of superconductive magnet assemblies and enables picking up MRI images at the central part of the open region. The support-shaped magnetic substances 7 and 8, the tabletop-shaped magnetic substances 9a and 9b, the magnetic pole structure, material, and manufacture structure shown in FIG. 3 are exactly the same as those indicated in Embodiment 1. Superconductive coils 16 and 17 are installed in low-temperature containers and the low-temperature containers are stored in vacuum containers. Furthermore, although omitted in FIG. 3 for simplicity, there is a structure for supporting the superconductive coils and between the vacuum containers and the low-temperature containers, there are thermal shields for prevention of transfer of radiant heat provided. Liquid helium is collected in the low-temperature containers, cools the superconductive coils at an extremely low temperature of 4.2 K, and keeps the superconductive coils in a superconductive state.

The upper and lower vacuum containers are kept at a predetermined distance by the support-shaped magnetic substances 7 and 8 installed between them. The support-shaped magnetic substances 7 and 8 function so as to mechanically support the upper and lower vacuum containers. Further, when a connection pipe, not shown in the drawing, for thermally connecting the upper and lower low-temperature containers is installed, there is no need to install one refrigerator respectively up and down and only one refrigerator is sufficiently useful for the system. Further, the number of the support-shaped magnetic substrates 7 and 8 does not need to be limited to 2 shown in the drawing and can be increased to 3 or 4 and to obtain a sense of release, one-sided magnetic substances may be used.

The circular ring-shaped hollows 14a and 14b have the same basic structure as that shown in FIG. 1 and the first space to the sixth space are sequentially formed starting from the center side of the magnetic field. The first, second, and fourth spaces are positioned slightly on the opposite side from the centers of the pole pieces 12a and 12b, and the third, fifth, and sixth spaces are positioned almost at the centers and have the same shape exactly symmetrically up and down. Magnetic substances in the same shape as that of the pole pieces 12a and 12b are used to efficiently transfer the magnetic field formed by superconductive coils 1, 2, 3, and 4 to the pole pieces 12a and 12b.

Figure 4:
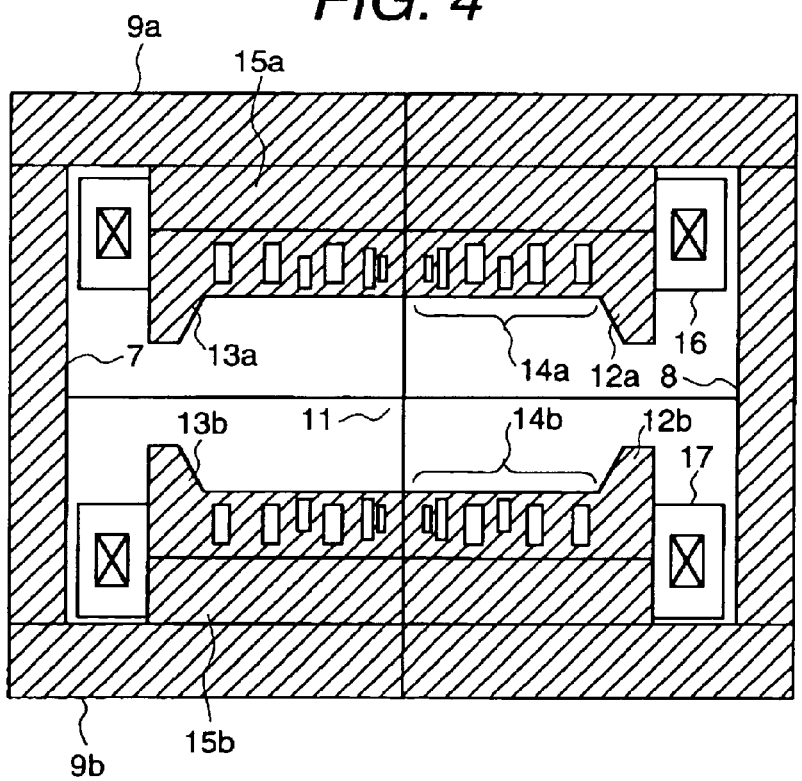
FIG. 4 is a cross sectional view of the magnet apparatus of Embodiment 2 of the present invention.

Further, in FIG. 4, in the magnetic resonance imaging apparatus having the pair of pole pieces 12a and 12b arranged opposite to each other across a measuring space, the superconductive coils 1, 2, 3, and 4 arranged on the respective outer peripheries of the pole pieces 12a and 12b, a pair of gradient coils, not shown in the drawing, arranged on the pole pieces 12a and 12b on the measuring space side, and a pair of RF irradiation coils, neither shown in the drawing, on the gradient coils on the measuring space side, the pole pieces 12a and 12b are the same as the pole pieces 12a and 12b shown in FIG. 1 and solid pole pieces 15a and 15b are provided outside them. Furthermore, in this embodiment, the ring-shaped pole pieces, shown in FIG. 4, projecting from the pole pieces 12a and 12b on the opposite side can be installed in the same way. Thereby, a highly uniform magnetic field can be obtained.

Also in FIG. 4, ring projections are provided on the outer peripheries of the pole pieces 12a and 12b and the one having the largest diameter among the circular ring-shaped hollows 14a and 14b is formed on the smooth face of the projection on the inner periphery side.

Further, in this embodiment, as a method for adjusting uniformity of the magnetic field of the magnet apparatus having the pair of pole pieces 12a and 12b arranged opposite to each other across the measuring space or the aforementioned magnetic resonance imaging apparatus, as mentioned above, spaces having geometric symmetry are formed in the pole pieces 12a and 12b. However, by adjusting the intensity of a local magnetic field in the magnetic substances constituting the pole pieces 12a and 12b or the internal material that the flow of the magnetic flux in the magnetic substances is adjusted, the uniformity of the magnetic field in the measuring space can be adjusted.

In this embodiment, the coils inside the magnets are all superconductive coils. However, the contents of the present invention are not limited to only the superconductive coils, and for example, coils using copper wires are acceptable, and furthermore, any coils transferring a current are acceptable. According to the present invention, as mentioned above, various embodiments can be considered. Needless to say, the present invention is not limited to all the embodiments disclosed here.

According to this embodiment, a magnet apparatus that the magnetic structure of the magnet apparatus for generating a uniform magnetic field using the magnetic poles is formed in a lower burst mode, and the cost of the magnets is decreased after all, and at the same time, the properties such as the uniformity of the magnetic field are improved, particularly a magnet apparatus suitable for MRI can be obtained.

(Embodiment 3)

Figure 5:
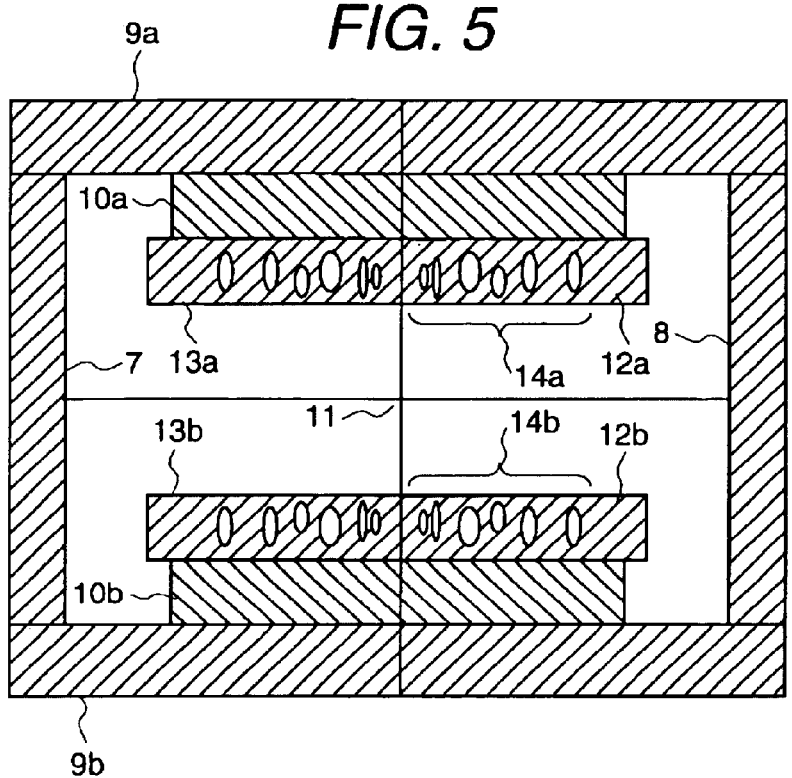
FIG. 5 is a cross sectional view of the magnet apparatus of Embodiment 3 of the present invention.
Figure 6:
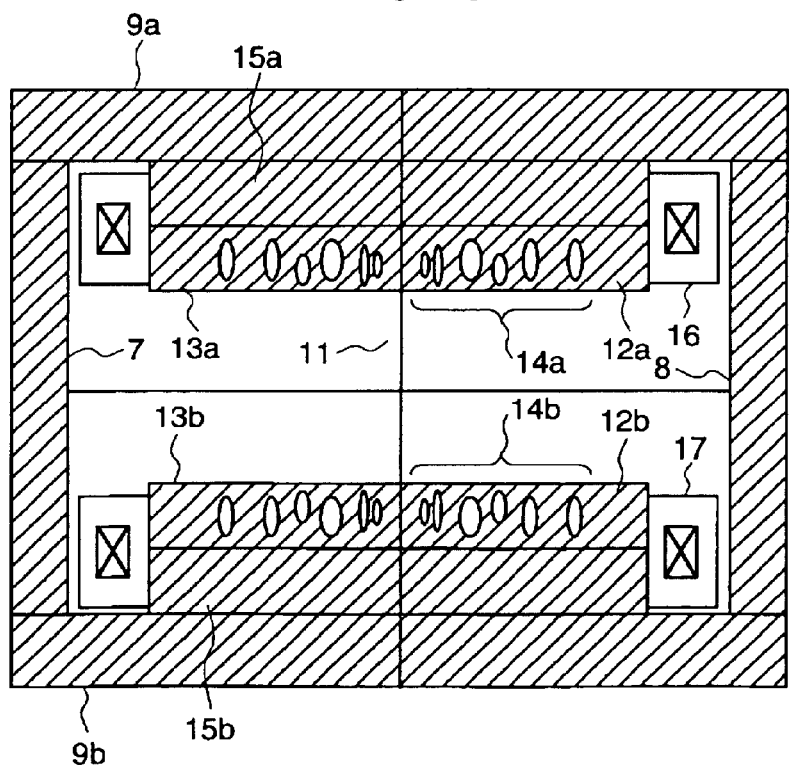
FIG. 6 is a cross sectional view of the magnet apparatus of Embodiment 3 of the present invention,.
Figure 7:
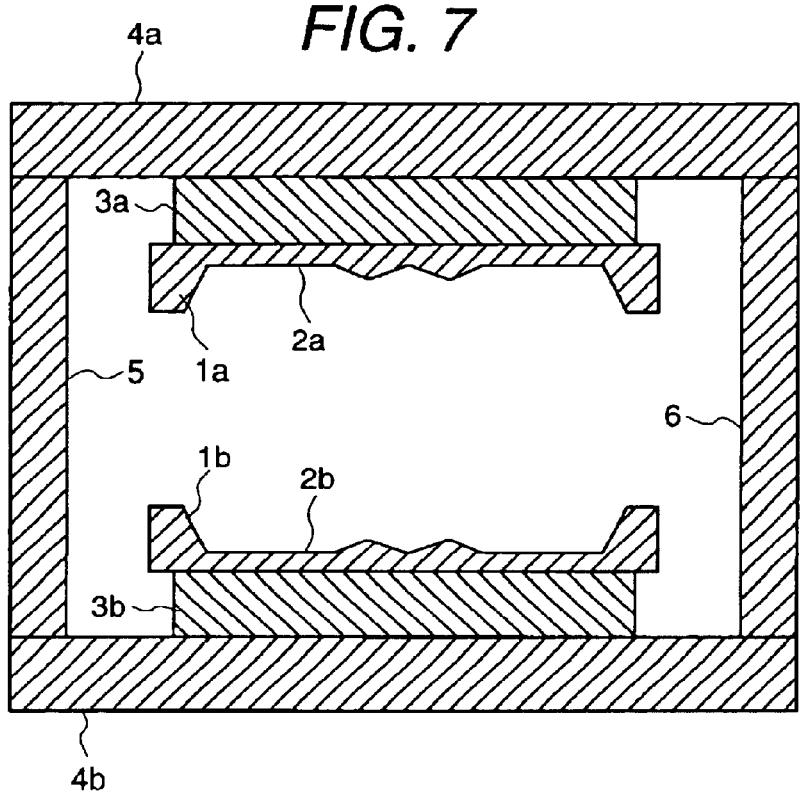
FIG. 7 is a cross sectional view of a conventional example of magnet apparatus.

In FIGS. 5 and 6, as a method for adjusting the uniformity of the magnetic field of the pole pieces 12a and 12b, the circular ring-shaped hollows 14a and 14b have the same constitution as the circular ring-shaped hollows 14a and 14b shown in FIGS. 1 and 3 and the sections are elliptic. Further, the opposite faces of the pole pieces 12a and 12b are all flat. The circular ring-shaped hollows 14a and 14b have the same basic structure as that shown in FIGS. 1 and 3 and starting from the center side of the magnetic field, the first space smallest in width and length, the second space which is equal in width to and longer in length than the first space, the third space which is equal in length to the first space and largest in width, the fourth space slightly smaller in width than the third space, and the fifth and sixth spaces slightly longer than the fourth space are sequentially formed. The first, second, and fourth spaces are positioned slightly on the opposite side from the centers of the pole pieces 12a and 12b, and the third, fifth, and sixth spaces are positioned almost at the centers and have the same shape exactly symmetrically up and down. Also in this embodiment, in the same way as with Embodiment 1 aforementioned, the cylindrical support-shaped magnetic substances 7 and 8 and the circular tabletop-shaped magnetic substances 9a and 9b constitute a magnetic circuit, and the pole pieces 12a and 12b are formed in the same way, and the same effect can be obtained.

In this embodiment, gradient coils not shown in the drawing can be installed on the opposite face sides of the pole pieces 12a and 12b. Furthermore, as shown in FIGS. 2 and 4, projections can be provided around the pole pieces 12a and 12b and the same effect can be obtained. Also in FIG. 5, the pole pieces 12a and 12b are larger in diameter than the permanent magnets 10a and 10b, and the largest diameter of the circular ring-shaped hollows 14a and 14b is smaller than the diameters of the permanent magnets 10a and 10b, and in the same way as with FIG. 2, projections and circular ring-shaped hollows can be formed. Furthermore, also in FIG. 6, the circular ring-shaped hollows 14a and 14b are formed in the same arrangement as that shown in FIG. 3.

According to this embodiment, a magnet apparatus that the magnetic structure of the magnet apparatus for generating a uniform magnetic field using the magnetic poles is formed in a lower burst mode, and the cost of the magnets is decreased after all, and at the same time, the properties such as the uniformity of the magnetic field are improved, particularly a magnet apparatus suitable for MRI can be obtained.

(Embodiment 4)

FIGS. 8 to 16 are cross sectional views of a pole piece relating to the present invention perpendicular to the direction of the magnetic field formed in the measuring space thereof. In this embodiment, the pole pieces are all preferably rectangular or elliptic on the section passing the central axis and perpendicular to the opposite face and all exactly symmetric up and down and the manufacture and material thereof are the same as those of Embodiment 1. Particularly, by a structure that a slit is formed on one member as a hollow 14 and the other member is made flat, the members are preferably united. In this embodiment, an irregular magnetic field formed by one cylindrical support-shaped magnetic substance arranged on each of both sides of the moving direction of the measuring space is corrected by the hollow 14 formed on the magnetic pole and the magnetic field of the measuring space is made more uniform. The shape and arrangement indicated below can be optimized by setting various shapes and arrangements beforehand and analyzing them by a computer.

Figure 8:
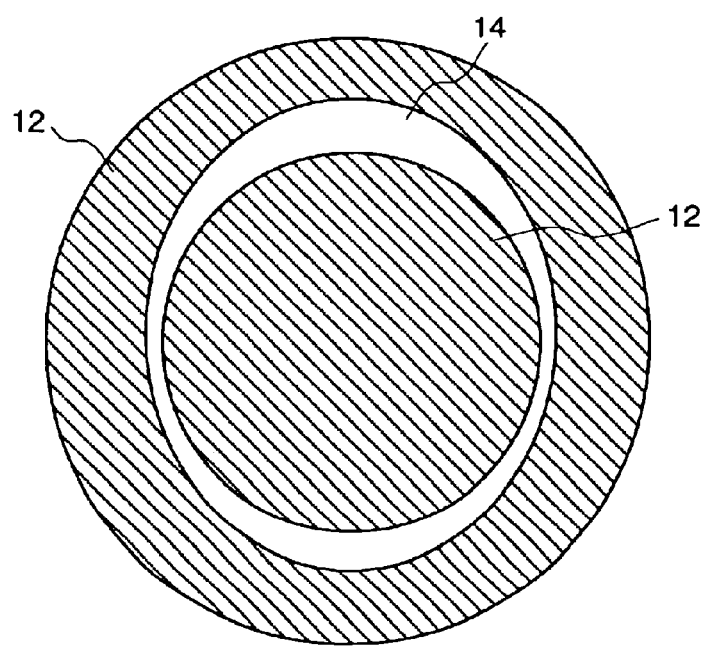
FIGS. 8 to 16 are cross sectional views of a pole piece relating to the present invention perpendicular to the direction of the magnetic field formed in the measuring space thereof.

In FIG. 8, the pole piece has one circular ring-shaped hollow 14, that is, a single hollow 14 in a shape which is wide this side and deep in the moving direction of the measuring space and is continuously changed.

Figure 9:
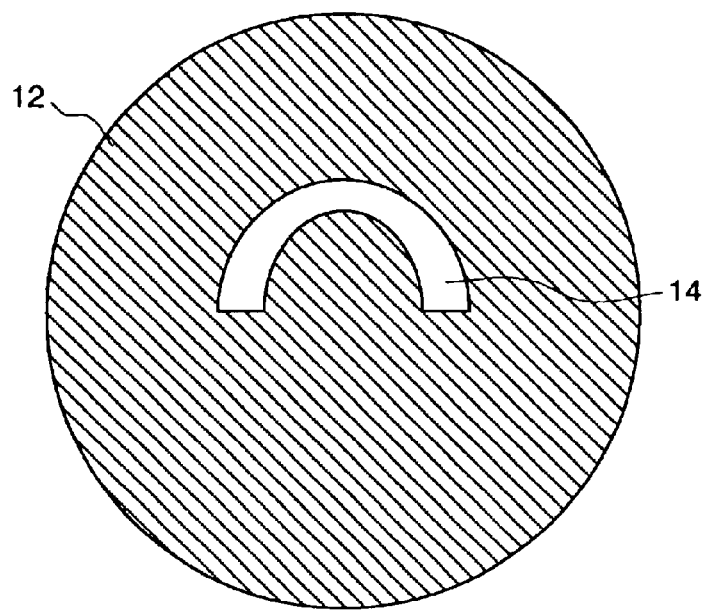

In FIG. 9, the pole piece has one semicircular ring-shaped hollow 14, that is, a single hollow 14 in a shape which is slightly narrow deep in the moving direction of the measuring space and is continuously changed.

Figure 10:
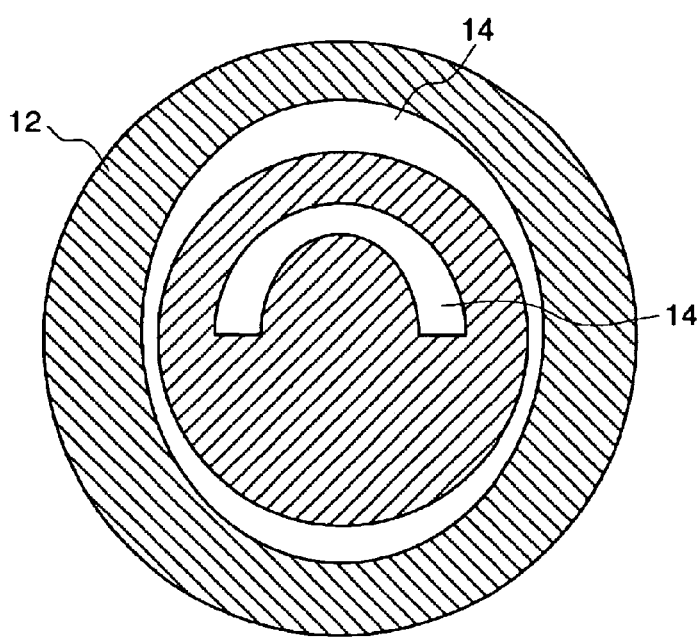

In FIG. 10, the pole piece is composed of a combination of the circular ring-shaped hollow 14 shown in FIG. 8 and the semicircular ring-shaped hollow 14 shown in FIG. 9.

Figure 11:
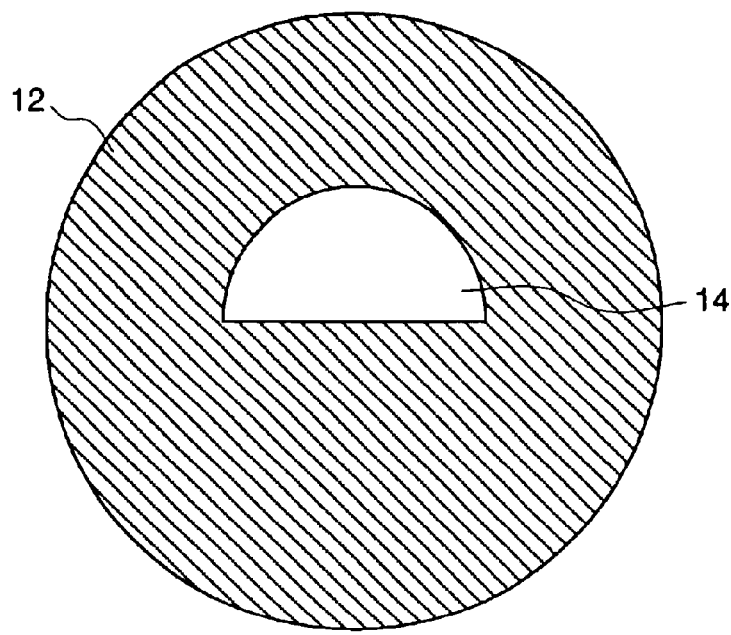

In FIG. 11, the pole piece has a semicircular 14 formed deeper in the moving direction of the measuring space than the central axis thereof.

Figure 12:
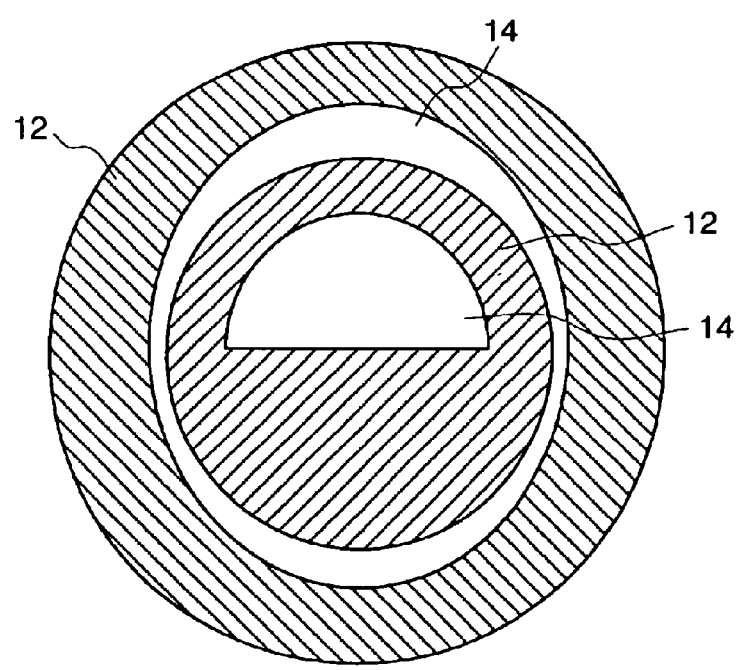

In FIG. 12, the pole piece is composed of a combination of the circular ring-shaped hollow 14 shown in FIG. 8 and the semicircular hollow 14 shown in FIG. 11.

Figure 13:
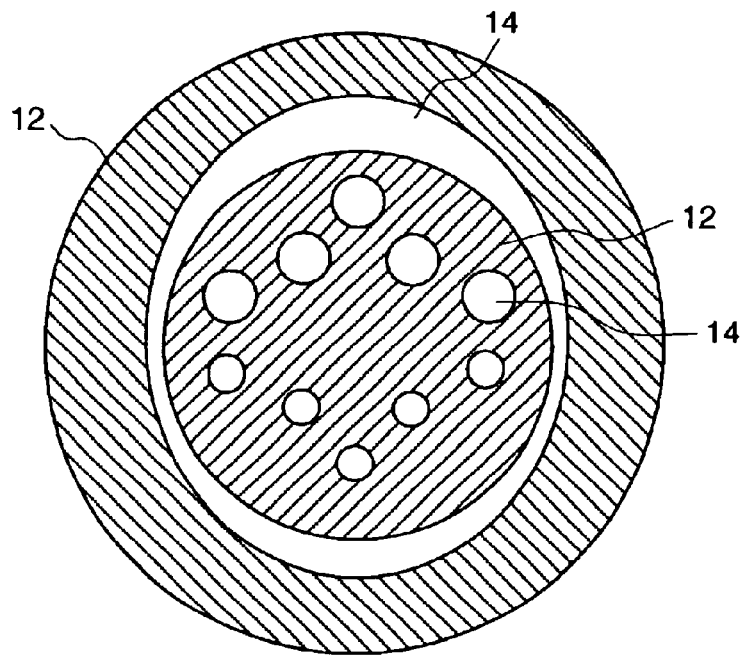

In FIG. 13, the pole piece is composed of a combination of the circular ring-shaped hollow 14 shown in FIG. 8 and inside the hollow 14, a plurality of different cylindrical hollows 14 having a small diameter this side of the central axis and a larger diameter than it deep in the moving direction of the measuring space which are formed in the same arrangement.

Figure 14:
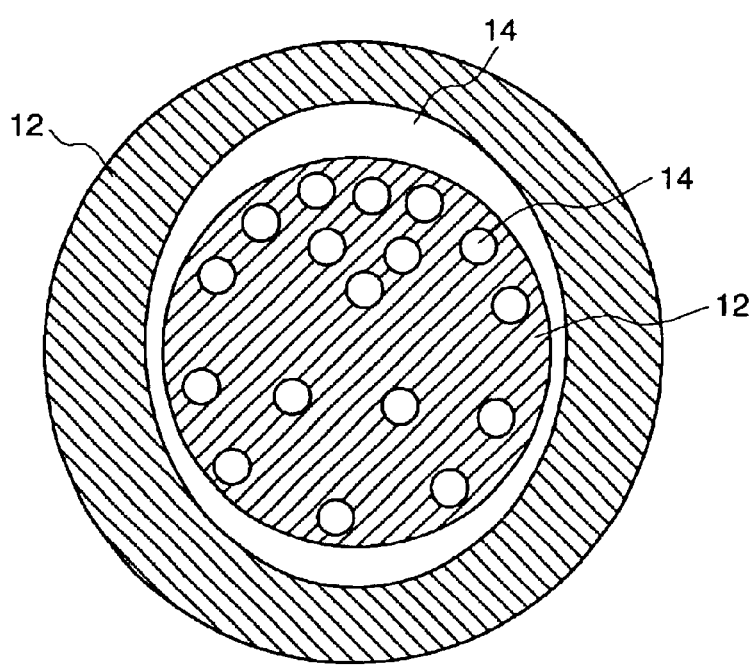

In FIG. 14, the pole piece is composed of a combination of the circular ring-shaped hollow 14 shown in FIG. 8 and inside the hollow 14, a plurality of cylindrical hollows 14 including very few hollows this side of the central axis and more hollows deep in the moving direction of the measuring space.

Figure 15:
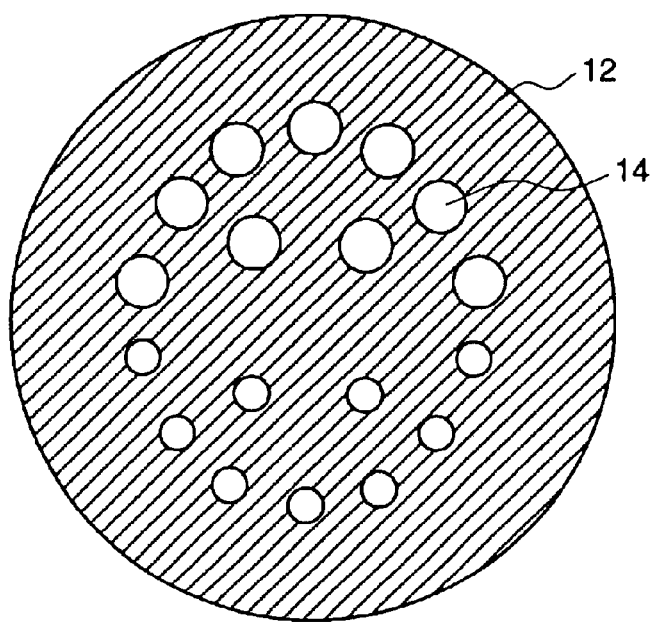

In FIG. 15, the pole piece has a plurality of different cylindrical hollows 14 having a small diameter this side of the central axis and a larger diameter than it deep in the moving direction of the measuring space.

Figure 16:
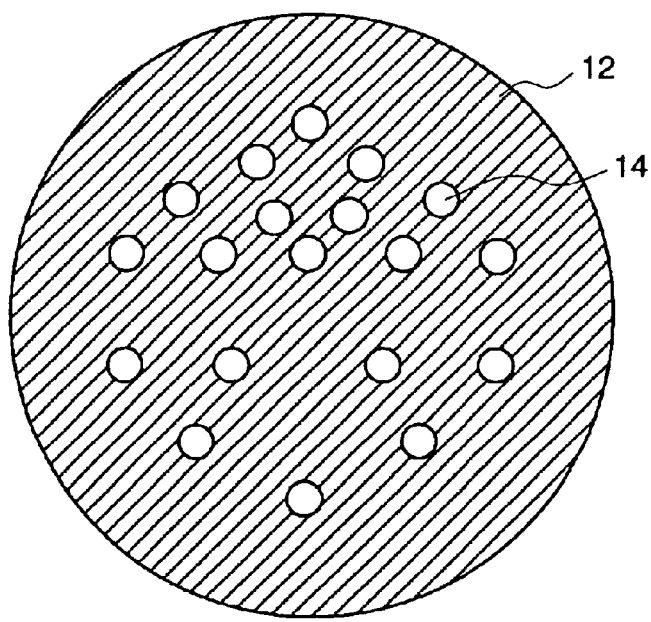

In FIG. 16, the pole piece has a plurality of cylindrical hollows 14 including very few hollows this side of the central axis and more hollows deep in the moving direction of the measuring space.

According to this embodiment, a magnet apparatus that the magnetic structure of the magnet apparatus for generating a uniform magnetic field using the magnetic poles is formed in a lower burst mode, and the cost of the magnets is decreased after all, and at the same time, the properties such as the uniformity of the magnetic field are improved, particularly a magnet apparatus suitable for MRI can be obtained.

(Embodiment 5)

Figure 17:
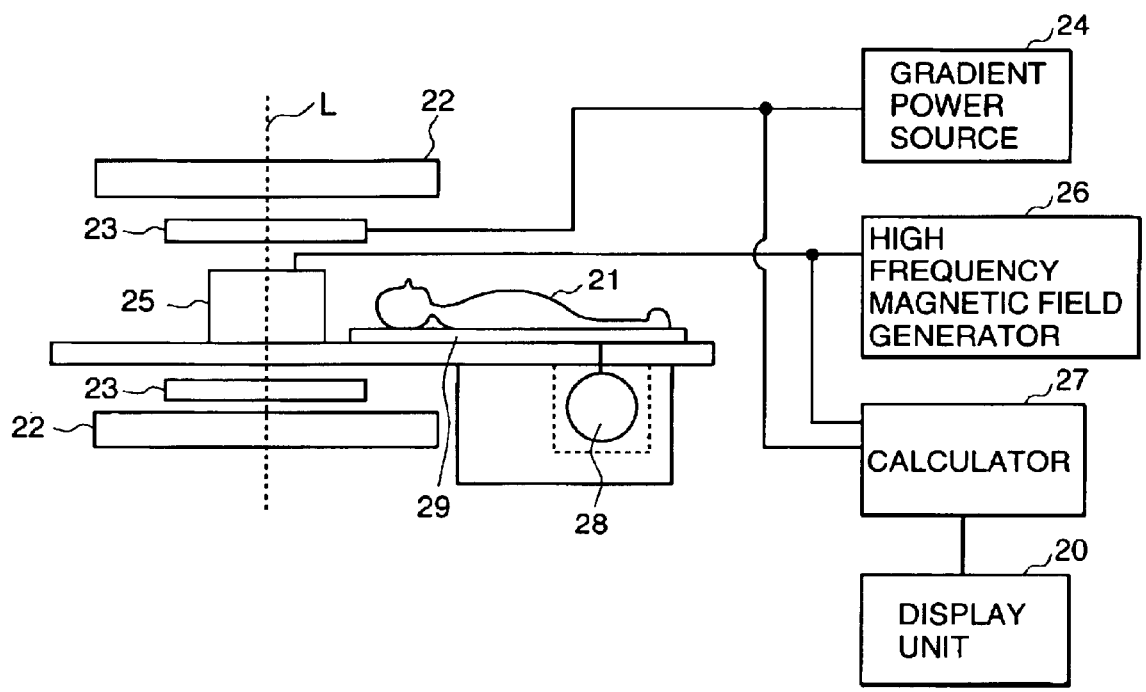
FIG. 17 is a block diagram of the magnetic resonance imaging apparatus of the present invention.

FIG. 17 is a block diagram of an MRI apparatus using the magnetic poles indicated in Embodiments 1 to 4 in a magnet apparatus. The MRI apparatus measures the density distribution and relaxation time distribution of atomic nuclear spins in a desired examination position in a patient using the NMR phenomenon and displays an image of an optional section of the patient from the measured data. The MRI apparatus, as shown in FIG. 17, includes static magnetic field generation means 22 for giving a static magnetic field to a patient 21, gradient coils 23 for inclining the static magnetic field intensity of the magnetic filed generated by the static magnetic field generation means 22 and forming a gradient magnetic field, a gradient power source 24 which is connected to the gradient coils 23 and applies an voltage, a probe 25 for transmitting a high frequency magnetic field to the patient 21 and receiving a nuclear magnetic resonance signal from the patient 21, a high frequency magnetic field generator 26 which is connected to the probe 25 and generates the high frequency magnetic field, a calculator 27 which is connected to the high frequency magnetic field generator 26 and the gradient power source 24, controls the high frequency magnetic field and gradient magnetic field, controls fetching of the nuclear magnetic resonance signal, and processes images, and a bed 29 for laying the patient 21 down and transporting him into the static magnetic field by driving of a driving mechanism 28. Furthermore, a display unit 20 inputs an image signal generated by the calculator 27 and displays it as a tomographic image and it is composed of, for example, a CRT. And, the movement of the bed 29 of this MRI apparatus by the driving mechanism 28, to prevent the patient 21 from a dynamic shock, is set at a fixed speed. Further, numeral L indicates a magnet center showing the center line of the static magnetic field generation means 22. The gradient coils 23 are composed of laminated coils respectively adjusting the three dimensions X, Y, and Z and connected to the magnetic poles by bolts. The coils X and Y are arranged so that respectively two ring coils form a circle opposite to each other and the coil Z is circular.

For the static magnetic field generation means 22 in this embodiment, the permanent magnets indicated in Embodiments 1 and 3 may be used, or the superconductive coils indicated in Embodiments 2 and 3 may be used, and for the magnetic poles, the aforementioned magnetic poles are used. Further, the hollows indicated in this embodiment, as mentioned above, may be rectangular or elliptic or in various shapes on the section perpendicular to the magnetic field and moreover, the hollows may be formed in other shapes or in a combined shape thereof. Further, projections can be formed around the pole pieces 12a and 12b, though the surface of each pole piece may be directly made uneven or projections may be provided on the tops of the pole pieces 12a and 12b.

According to this embodiment, a magnet apparatus that the magnetic structure of the magnet apparatus for generating a uniform magnetic field using the magnetic poles is formed in a lower burst mode, and the cost of the magnets is decreased after all, and at the same time, the properties such as the uniformity of the magnetic field are improved, particularly a magnet apparatus suitable for MRI can be obtained. Further, according to this embodiment, in the final magnetic field fine adjustment process of the measuring space, the adjustment sensitivity thereof can be easily rationalized.

INDUSTRIAL FIELD OF APPLICATION

According to this embodiment, a magnet apparatus that the magnetic structure of the magnet apparatus for generating a uniform magnetic field using the magnetic poles is formed in a lower burst mode, and the cost of the magnets is decreased after all, and at the same time, the properties such as the uniformity of the magnetic field are improved and a magnetic resonance imaging apparatus using it can be provided.

What is claimed is:

1. Magnetic poles arranged opposite to each other via support magnetic substances across a measuring space have at least one of a plurality of hollows for correcting an irregular magnetic field due to said support magnetic substances and a single hollow having a shape continuously changing on a section perpendicular to the direction of a magnetic field formed in said measuring space, wherein in order to make said magnetic field uniform, arrangement of said plurality of hollows and said shape of said single hollow are adjusted.

2. Magnetic poles arranged opposite to each other across a measuring space have at least one of a plurality of circular ring-shaped hollows and semicircular ring-shaped hollows formed concentrically with a central axis of a magnetic field.

3. Magnetic poles arranged opposite to each other across a measuring space have at least one of a plurality of circular ring-shaped hollows and semicircular ring-shaped hollows formed concentrically with a central axis of a magnetic field, wherein said circular ring-shaped hollows are rectangular or elliptic on a section passing said central axis and perpendicular to opposite faces.

4. Magnetic poles arranged opposite to each other across a measuring space have a circular ring-shaped and a semicircular ring-shaped hollow formed concentrically with a central axis of a magnetic field.

5. Magnetic poles arranged opposite to each other across a measuring space have a circular ring-shaped and a semicircular ring-shaped hollow formed concentrically with a central axis of a magnetic field, wherein said hollows are rectangular or elliptic on a section passing said central axis and perpendicular to opposite faces.

6. Magnetic poles arranged opposite to each other across a measuring space have at least one of a plurality of hollows and a single hollow having a shape continuously changing on a section perpendicular to the direction of a magnetic field formed in said measuring space.

7. Magnetic poles according to claim 6, wherein in said plurality of hollows, said sections perpendicular to said direction of said magnetic field are different in shape from each other.

8. Magnetic poles according to claim 6, wherein in said plurality of hollows, said sections perpendicular to said direction of said magnetic field are the same in shape and different in number depending on a location.

9. Magnetic poles according to claim 6, wherein said hollows are different in a shape of said sections from each other.

10. Magnetic poles according to claim 6, wherein said circular ring-shape hollows are longer in an opposite direction than in a radial direction on said section passing said central axis of said magnetic field and perpendicular to said opposite faces.

11. Magnetic poles according to claim 6, wherein in said hollows, said section passing said central axis of said magnetic field and perpendicular to said opposite faces is rectangular or elliptic.

12. Magnetic poles according to claim 6, wherein said opposite faces across said measuring space have ring protections on the sides of said opposite faces and the faces excluding said projections are flat.

13. A magnet apparatus comprising a pair of magnetic poles arranged opposite to each other across a measuring space, wherein for said magnetic poles, said magnetic poles stated in claim 6 are used.

14. A magnet apparatus according to claim 13, wherein said hollows are arranged symmetrically at mutually opposite positions and have a same shape on said section perpendicular to said direction of said magnetic field formed in said measuring space and said section passing said central axis of said magnetic field and perpendicular to said opposite faces.

15. A magnet apparatus comprising a pair of magnetic poles arranged opposite to each other across a measuring space and magnetic field generators arranged in the neighborhoods of said respective magnetic poles, wherein for said magnetic poles, said magnetic poles stated in claim 6 are used.

16. A magnet apparatus a comprising a pair of magnetic poles arranged opposite to each other across a measuring space, coils arranged on outer peripheries of said respective magnetic poles, and containers for containing said respective coils, wherein for said magnetic poles, said magnetic poles stated in claim 6 are used.

17. A magnet apparatus comprising static field generation sources arranged opposite to each other, magnetomotive force sources magnetically connected to said static magnetic field generation sources, and circular magnetic poles arranged on opposite face sides of said static magnetic field generation sources, wherein for said magnetic poles, said magnetic poles stated in claim 6 are used.

18. A magnet apparatus comprising a pair of magnetic poles arranged opposite to each other across a measuring space and permanent magnets arranged on said opposite outsides of said magnetic poles, wherein for said magnetic poles, said magnetic poles stated in claim 6 are used.

19. A magnet apparatus comprising a pair of magnetic poles arranged opposite to each other across a measuring space and a pair of superconductive coils arranged on outer peripheries of said respective magnetic poles, wherein for said magnetic poles, said magnetic poles stated in claim 6 are used.

20. A magnetic resonance imaging apparatus comprising a magnet apparatus having magnetic field generators arranged in respective neighborhoods of a pair of magnetic poles arranged opposite to each other for giving a static magnetic field to a space to be measured across a patient, a gradient coil for inclining intensity of said static magnetic field generated by said magnet apparatus and forming a gradient magnetic field, a gradient power source which is connected to said gradient coil and applies an voltage, a probe for transmitting a high frequency magnetic field to said patient and receiving a nuclear magnetic resonance signal from said patient, a high frequency magnetic field generator which is connected to said probe an generates said high frequency magnetic field, a calculator which is connected to said high frequency magnetic field generator and said gradient power source, controls said high frequency magnetic field and said gradient magnetic field, controls fetching of said nuclear magnetic resonance signal, and processes images, a bed for laying said patient down and transporting him into said static magnetic field by driving means, and a display unit for inputting said signal calculated by said calculator and displaying it as a tomographic image, wherein for said magnetic poles, said magnetic poles stated in claim 6 are used.

21. A magnetic resonance imaging apparatus according to claim 20, wherein said driving mechanism for moving said bed has control means for setting movement of said patient at a fixed speed.

* * * * *